(12) United States Patent
Divakaruni et al.

(10) Patent No.: US 6,326,260 B1
(45) Date of Patent: Dec. 4, 2001

(54) GATE PRESPACERS FOR HIGH DENSITY, HIGH PERFORMANCE DRAMS

(75) Inventors: Ramachandra Divakaruni, Somers, NY (US); James William Adkisson, Jericho, VT (US); Mary Elizabeth Weybright, Pleasant Valley; Scott Halle, Hopewell Junction, both of NY (US); Jeffrey Peter Gambino, Westford, VT (US); Heon Lee, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,703

(22) Filed: Jun. 22, 2000

(51) Int. Cl.[7] ............................................... H01L 21/8242
(52) U.S. Cl. ..................... 438/241; 438/592; 438/595; 438/700
(58) Field of Search ................................ 438/142, 241, 438/242, 159, 243, 239, 592, 585, 595, 700, 770

(56) References Cited

U.S. PATENT DOCUMENTS

| | | | |
|---|---|---|---|
| 5,304,504 | * 4/1994 | Wei et al. | 437/44 |
| 5,783,458 | 7/1998 | Kadosh et al. | 438/305 |
| 5,858,848 | 1/1999 | Gardner et al. | 438/305 |
| 5,863,824 | 1/1999 | Gardner et al. | 438/303 |
| 5,882,973 | 3/1999 | Gardner et al. | 438/279 |
| 5,905,293 | 5/1999 | Jeng et al. | 257/508 |
| 5,909,622 | 6/1999 | Kadosh et al. | 438/286 |
| 5,950,091 | 9/1999 | Fulford, Jr. et al. | 438/303 |
| 5,966,600 | 10/1999 | Hong | 438/253 |
| 5,970,354 | 10/1999 | Hause et al. | 438/305 |
| 5,989,950 | * 11/1999 | Wu | 438/228 |
| 6,083,816 | * 7/2000 | Kanamori | 438/585 |
| 6,107,171 | * 8/2000 | Tsai | 438/584 |
| 6,197,632 | * 3/2001 | Bronner et al. | 438/241 |
| 6,200,834 | * 3/2001 | Bronner et al. | 438/142 |

* cited by examiner

Primary Examiner—Olik Chaudhuri
Assistant Examiner—Kurt Eaton
(74) Attorney, Agent, or Firm—Scully, Scott, Murphy & Presser; Ira D. Blecker, Esq.

(57) ABSTRACT

A memory device structure is provided in which the array oxide layer has a thickness that is greater than the thickness of the support oxide layer. Specifically, the structure comprises a semiconductor substrate having a gate oxide layer formed thereon, said substrate including array regions and support regions, said array regions include at least one patterned gate conductor, said patterned gate conductor having a polysilicon layer formed on said gate oxide layer, a conductor material layer formed on said polysilicon layer, and a nitride cap layer formed on said conductor material layer, said nitride cap layer and said conductor material layer having spacers formed on sidewalls thereof and said polysilicon layer having an array oxide layer formed on sidewalls thereof, said spacers being substantially flush with the oxide sidewalls, said support regions include at least one patterned gate conductor, said patterned gate conductor having a polysilicon layer formed on said gate oxide layer, a conductor material layer formed on said polysilicon layer, and a nitride cap layer on said conductor material layer, said polysilicon layer having a support oxide layer formed on sidewalls thereof, wherein said array oxide layer has a thickness that is greater than said support oxide layer.

14 Claims, 3 Drawing Sheets

GATE PRESPACERS FOR HIGH DENSITY, HIGH PERFORMANCE DRAMS

FIELD OF THE INVENTION

The present invention relates to a method of manufacturing semiconductor memory devices and, more particularly, to a method of forming a gate conductor for a dynamic random access memory (DRAM) structure wherein spacers (hereinafter referred to as prespacers) are formed prior to completely etching the gate conductor and wherein the thickness of the oxide layers in the array and support regions of the structure are varied so as to improve device performance.

BACKGROUND OF THE INVENTION

In semiconductor memory device manufacturing, the channel length of the DRAM transfer gate devices continues to shrink aggressively. Conventional scaling techniques are limited in their applicability for low leakage DRAM transfer devices. There is thus a need for novel integration schemes with only limited shrinking of the channel length.

As the DRAM cell size decreases, the transfer gate has consequently shrunk with it. Earlier cell sizes (>8 $F^2$) allow for wiggled gates to keep the array transistor off leakage to a minimum. With the onset of 8 $F^2$ cells with equal lines and spaces at minimum feature size, F, in the wordline direction, there is need to provide larger transfer gate lengths of the array pass transistor by non-lithographic techniques. Conventional scaling techniques use shallow junctions (limited by surface leakage and charge writeback characteristics), high channel doping concentrations or halo implants which increase leakage and are thus not easy to incorporate in DRAM processing.

One known process is based on the BEST (BuriEd Strap) cell modified for 8 $F^2$. Once the trench capacitor and shallow trench isolation are formed, the gate conductor stack is put down. Typically, the gate conductor stack consists of polysilicon and $WSi_x$ capped with SiN. During the gate mask opening step, the SiN is patterned and the etch typically stops in the $WSi_x$, the resist is stripped and the remaining gate conductor stack is etched with the SiN as a hard mask. Post gate sidewall oxidation, the SiN spacers are formed, followed by a barrier SiN film and boron phosphorus silicate glass (BPSG) deposition, densification and planarization. A TEOS (tetraethylorthosilicate) layer is formed for the damascene bitlines and the bitline contacts are etched borderless to the gates prior to forming the bitline wiring layer (generally tungsten).

Additionally, it is known that the present processing of DRAM structures in the array portion of the device directly links the lithographic dimension to the polysilicon linewidth. Hence, if there is resist webbing, the increase in the polysilicon linewidth is limited which directly affects the retention of the DRAM cell.

The present invention is thus directed to further improvements in gate conductor processing which can be easily incorporated into existing DRAM processing techniques.

SUMMARY OF THE INVENTION

One object of the present invention is to provide a method of manufacturing a gate conductor of a memory device wherein the length of the gate polysilicon can be tailored so as to improve the retention of the DRAM cell.

Another object of the present invention is to provide a method of manufacturing a gate conductor of a memory device wherein the length of the gate polysilicon can be tailored so as to reduce array off-state leakage.

A yet further object of the present invention is to provide a method of manufacturing a gate conductor which can be easily implemented into existing DRAM processing techniques.

A still further object of the present invention is to provide a method of manufacturing sub-8 $F^2$ memory devices in which the method of the present invention can be employed in fabricating the gate conductor.

Further objects of the present invention are to form two different sidewall oxide thicknesses without increasing the thermal budget of the process and to achieve the differential oxide thicknesses without the need of utilizing a critical mask.

These and other objects and advantages are achieved in the present invention by forming prespacers on the sidewalls of the gate conductor prior to completely etching the gate conductor stack. Specifically, the method of the present invention, which achieves all of the above-mentioned objects, while overcoming the drawbacks mentioned above with prior art processes, comprises the steps of:

(a) providing a semiconductor structure including at least a gate oxide layer formed on a surface of a semiconductor substrate, said structure being divided into array regions and support regions which may have different oxide thicknesses;

(b) forming a gate stack on said structure, said gate stack including a layer of polysilicon formed on the gate oxide layer, a conductor material layer formed on said layer of polysilicon, and a nitride cap layer formed on said conductor material layer;

(c) partially mask open etching the gate stack by patterning the nitride cap layer and etching through the gate stack stopping on said layer of polysilicon;

(d) forming spacers on exposed sidewalls of said partially etched gate stack;

(e) completing said mask open etching in said array regions by removing any exposed polysilicon, while not etching said layer of polysilicon in the support regions;

(f) performing a first oxidation step on the structure so as to form an oxide layer on exposed polysilicon sidewalls in said array regions while simultaneously forming a sacrificial oxide layer on said layer of polysilicon in said support regions;

(g) selectively removing said spacers in said support regions of said structure;

(h) selectively removing said sacrificial oxide layer and said layer of polysilicon in said support regions; and (i) performing a second oxidization step on said structure so as to form an array oxide layer and a support oxide layer, said array oxide layer having a thickness that is greater than the support oxide layer, said array oxide layer comprising oxide layers from said first and second oxidation steps.

In one embodiment of the present invention, a barrier layer is formed between the layer of polysilicon and conductor material layer. When a barrier layer is present, it may be optionally removed during one of the above mentioned etching steps, i.e., steps (c) or (e).

In accordance with another aspect of the present invention, a memory device structure is provided in which the array oxide layer has a thickness that is greater than the thickness of the support oxide layer. Specifically, the inventive structure of the present invention comprises:

a semiconductor substrate having a gate oxide layer formed thereon, said substrate including array regions and support regions, said array regions include at least one patterned gate conductor, said patterned gate conductor having a polysilicon layer formed on said gate oxide layer, a conductor material layer formed on said polysilicon layer, and a nitride cap layer formed on said conductor material layer, said nitride cap layer and said conductor material layer having spacers formed on sidewalls thereof and said polysilicon layer having an array oxide layer formed on sidewalls thereof, said spacers being substantially flush with the oxide sidewalls, and said support regions include at least one patterned gate conductor, said patterned gate conductor having a polysilicon layer formed on said gate oxide layer, a conductor material layer formed on said polysilicon layer, and a nitride cap layer formed on said conductor material layer, said polysilicon layer having a support oxide layer formed on sidewalls thereof, wherein said array oxide layer has a thickness that is greater than said support oxide layer.

DETAILED DESCRIPTION OF THE INVENTION

The present invention which is directed to a method of forming a novel gate conductor structure for a semiconductor memory device such as a DRAM device will now be described in more detail by referring to FIGS. 1–7 that accompany the present application. It should be noted that in the accompanying drawings like references numerals are used for describing like and corresponding elements.

Figure 1:
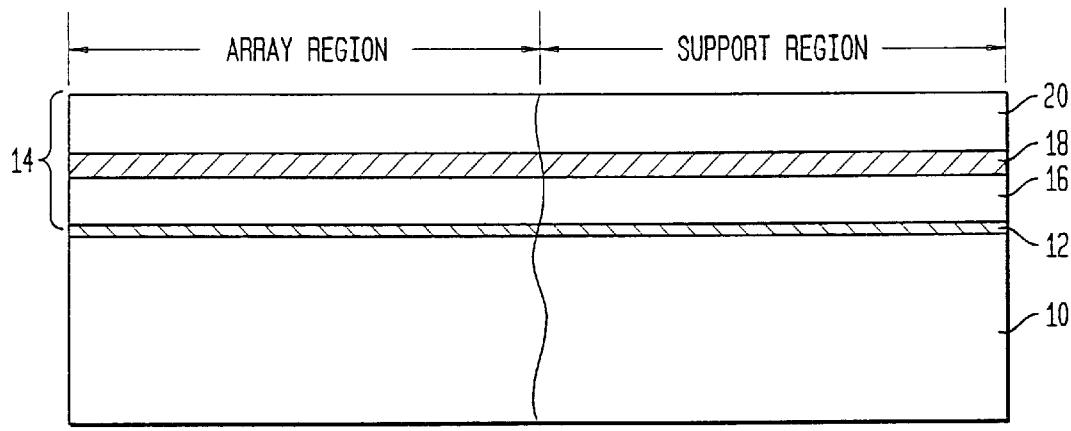
FIGS. 1–7 are cross-sectional views depicting a semiconductor memory structure through the various processing steps of the present invention.

Reference is first made to FIG. 1 which illustrates a cross-sectional view of an initial structure that can be employed in the present invention. Specifically, the initial structure shown in FIG. 1 comprises semiconductor substrate 10 having gate oxide layer (or layers) 12 formed thereon. In the drawings, the left-hand side is labeled as the "array region", while the right-hand side is labeled as the "support region". The array region is those regions of the semiconductor wafer which have devices which benefit from longer channel lengths. Thus, the array region is not only the regions which contain the DRAM capacitors (and hence access transistors to the capacitors) but also regions such as the wordline driver circuits, Off-Chip Driver (OCD) circuits and the like. These circuits operate at higher voltages than the support circuit regions which generally (but not always) operate at lower voltages and consist of higher performance transistors. Although the drawings of the present application depict only one of each region therein, the present invention works equally well when a plurality of said array regions and said support regions are present.

FIG. 1 also shows the presence of gate stack 14 that is formed on an exposed surface of the gate oxide layer. As shown, the gate stack employed in the present invention includes at least a layer of polysilicon 16 formed on said gate oxide layer, conductor material layer 18 formed on said layer of polysilicon and nitride cap layer 20 formed on said conductor material layer.

The initial structure illustrated in FIG. 1 is composed of conventional materials that are well known to those skilled in the art and conventional processes, also well known to those skilled in the art, are used in fabricating the same. Specifically, semiconductor substrate 10 comprises any semiconducting material including, but not limited to: Si, Ge, SiGe, GaAs, InAs, InP and all other III/V semiconductor compounds. Layered substrates comprising the same or different semiconductor material, e.g., Si/SiGe, and silicon-on-insulators (SOIs) are also contemplated herein. The substrate may be of the n or p-type depending on the desired device to be fabricated. The substrate may contain active device regions, wiring regions, isolation regions or other like regions. For clarity, these regions are not shown in the drawings, but are nevertheless intended to be included within region 10.

Gate oxide layer 12 comprises a conventional oxide material such as $SiO_2$ which is formed on the surface of substrate 10 using a conventional thermal growing process, or alternatively, the gate oxide layer may be formed by a conventional deposition process such as chemical vapor deposition (CVD), plasma-assisted CVD, sputtering, evaporation and other like deposition processes. The thickness of the gate oxide layer may vary and is not critical to the present invention. Layer 12 may also constitute a high-k dielectric such as oxides of Ta, Zr, Al or combinations thereof.

Polysilicon layer 16 which is a doped layer is formed on the surface of gate oxide layer 12 utilizing a conventional deposition process such as CVD or plasma-assisted CVD. Following deposition of the polysilicon layer, the deposited polysilicon is then doped with an appropriate dopant, or alternatively, an in-situ doping deposition process is employed in forming polysilicon layer 16. The thickness of the polysilicon layer may vary and is also not critical to the present invention. It is noted that polysilicon layer 16 is the gate polysilicon layer of the gate structure of the present invention.

An optional barrier layer (not shown in the drawings) may be formed on the polysilicon layer prior to forming the conductor material layer. The optional barrier layer is formed utilizing conventional deposition processes such as those mentioned above and the optional barrier layer may be composed of a material such as SiN, TaN, TaSiN, WN, $TaSi_2$ and other like materials that can prevent diffusion of a conductive material therethrough.

Conductor material layer 18 is formed on the layer of polysilicon utilizing a conventional deposition process such as CVD, plasma-assisted CVD, plating and evaporation. The conductor material layer employed in the present invention includes any material that is conductive. Illustrative examples include, but are not limited to: elemental metals such as W, Pt, Pd, Ru, Rh, and Ir; silicides and nitrides of these metals; and combinations thereof.

A highly preferred conductive material is $WSi_x$ (tungsten silicide) which is formed by depositing a layer of W and then a layer of polysilicon, annealing the structure to provide said $WSi_x$ layer and removing any remaining polysilicon that is not silicided utilizing a conventional wet etch process that is highly selective in removing polysilicon as compared to metal. That is, when the conductor material layer is composed of a metallic silicide, a conventional salicide process is used in forming the layer. Conventionally, the polysilicon and $WSi_x$ are deposited together in a CVD chamber.

The uppermost layer of the gate stack is nitride cap layer 20 which is formed utilizing a conventional deposition process such as CVD. The nitride cap is typically composed of a nitride material such as SiN and other like nitride-containing materials that prevent oxygen from diffusing into the structure. This layer may also be a deposited oxide such as TEOS. Note that an optional barrier made of a different dielectric than the nitride cap (say TEOS) may be deposited below the final nitride cap layer (this is not shown in the figures). This optional barrier may be used as an etch stop layer during the mask open process, as an etch stop layer for the subsequent prespacer etch as well as a barrier to the prespacer removal process in the support regions.

The structure shown in FIG. 1 may be planarized after formation of each successive layer, or a single planarization process may be performed in providing the structure. If the incoming wafer is sufficiently planar, planarization of the gate stack is typically not needed.

Figure 2:
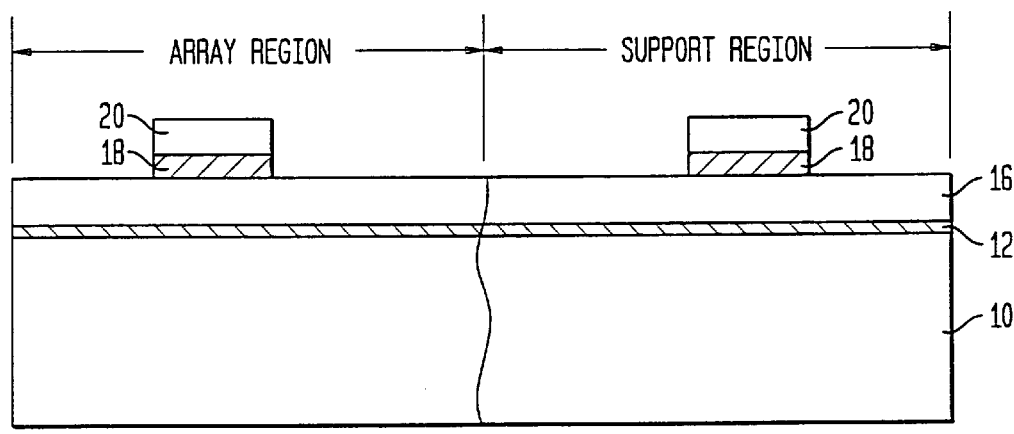

Next, as illustrated in FIG. 2, the gate stack is subjected to a partial mask open etching process wherein conventional lithography (including applying a photoresist, patterning the photoresist and developing the pattern) and etching (such as reactive-ion etching (RIE), ion-beam etching, plasma-etching and combinations thereof) are used in partially etching through the gate stack stopping on the layer of polysilicon.

Specifically, the partial mask open process employed in the present invention removes regions of the nitride cap and conductor material layers which do not include a patterned photoresist thereon providing the partially etched gate conductor stack shown in FIG. 2 It is noted that in the subsequent drawings, each region is shown containing only one gate conductor. This is done for clarity and, in no way limits the number of gate conductors that can be formed in each region of the structure.

Figure 3:
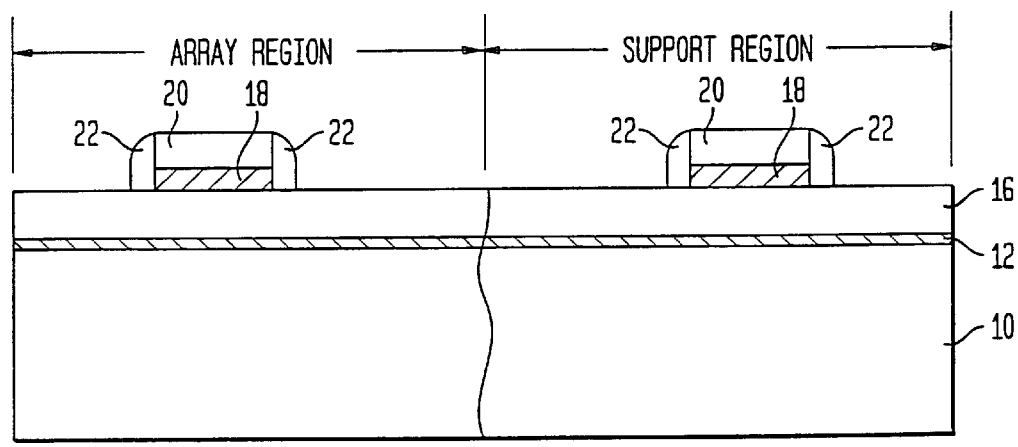

Next, spacers 22 are formed on the exposed sidewalls of the partially etched gate conductor stack in both the array and support regions of the structure (See, FIG. 3). In one embodiment of the present invention, the spacers are formed utilizing conventional deposition processes such as CVD and etching, i.e., RIE. In another embodiment of the present invention, the etching step is omitted and the deposited spacer material is etched in a later processing step of the present invention, i.e., when the gate polysilicon layer is etched.

Notwithstanding which technique is employed in forming the spacers, the spacers are composed of a nitride-containing material which may be the same or different than the cap nitride layer or the optional barrier layer. The thickness of the spacers is not critical to the present invention, but typically the spacers have a thickness of from about 5 to about 500 nm.

It should be noted that spacers 22 are also sometimes referred to herein as prespacers since the spacers are formed prior to completely etching the gate conductor stack. Moreover, the prespacers are removed in the support region of the structure in a subsequent processing step, but remain in the array region throughout the entire process. The prespacers in the array region are substantially flush with the vertical sidewalls of the gate conductor.

Figure 4:
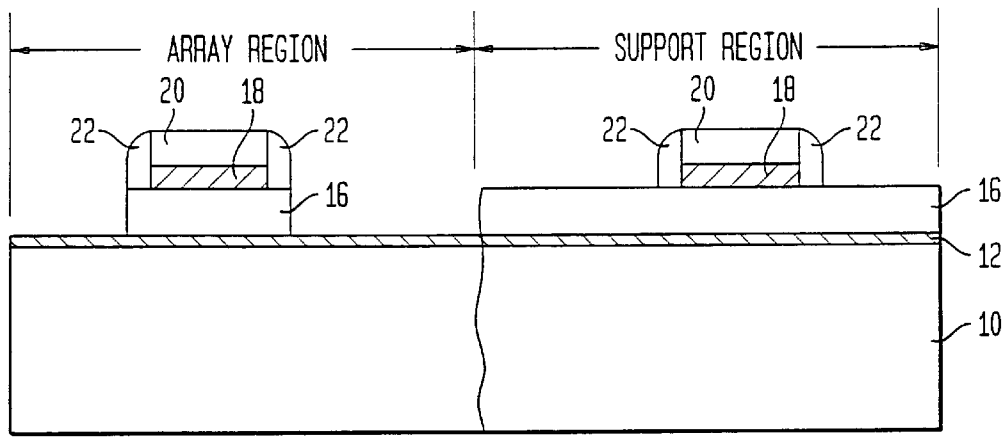

A conventional mask (not shown in the drawings) is then formed over the support region of the structure and the exposed layer of polysilicon is selectively etched in only the array regions to complete the etching of the gate conductor providing the structure shown in FIG. 4. The selective etch used in this point of the present invention includes the use of an anisotropic etching process such as reactive-ion etching (RIE) that is highly selective in removing polysilicon as compared to nitride-containing or oxide materials.

Following formation of the etched gate conductor in the array regions of the structure, the mask used in protecting the support regions is removed from the structure utilizing a conventional stripping process.

Figure 5:
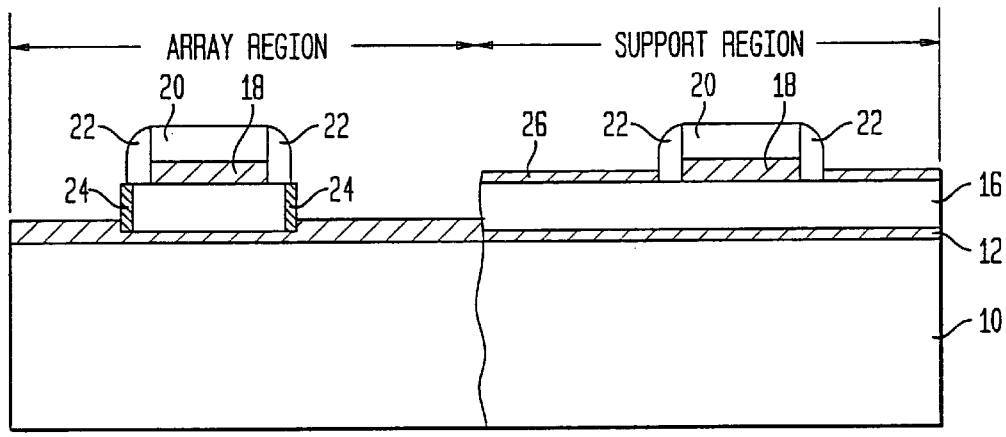
Figure 6:
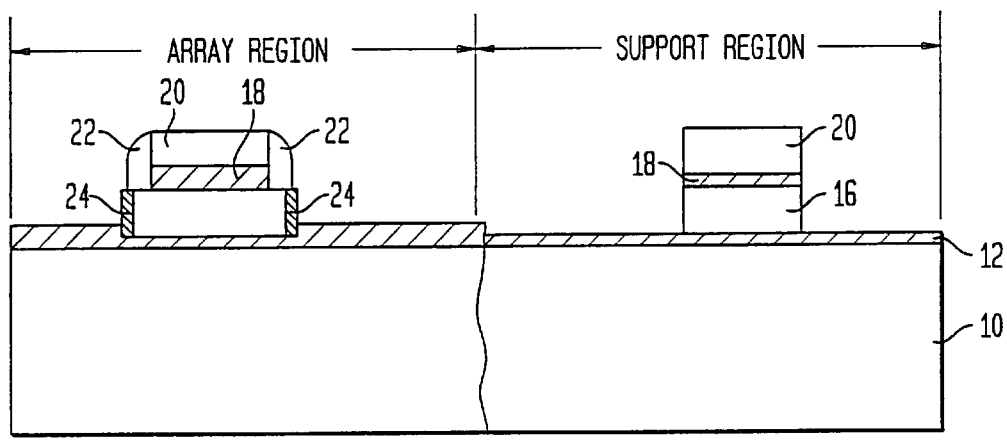

Next, as shown in FIG. 5, the structure is subjected to a first oxidation step so as to form oxide layer 24 on exposed sidewalls of any remaining polysilicon in said array regions, while simultaneously forming a sacrificial oxide layer 26 in said support regions. It should be noted that during the first oxidation step, a thin oxide layer forms on the oxide layer in the array regions as well as on the sidewalls of the gate polysilicon layer. Thus, the oxide layer in the array regions adjacent to the gate polysilicon, at this point of the inventive method, is thicker than the oxide in the support regions and in regions under the gate polysilicon in the array regions. The different thickness in the oxide layers is shown in FIG. 5.

The first oxidation step employed in the present invention is carried out at a temperature of greater than 850° C., preferably greater than 900° C., in an oxidizing ambient such as air, ozone or oxygen. A single temperature may be employed, or alternatively, a series of various ramp and soak cycles may also be used. The time in which the first oxidation step is performed may vary depending on the desired thickness of the oxide/sacrificial oxide layers to be formed, but typically the oxidation step results in an oxide thickness of from about 3 to about 20 nm.

Following the first oxidation step of the present invention, a second mask (not shown in the drawings) is formed in the array regions of the structure. Prespacers 22 are then removed in the support regions. Typically, the prespacers are made of SiN and are removed by an isotropic etch such as a Chemical Downstream Etch (CDE). Subsequently, with the mask in place (covering the array region), oxide layer 26 is removed in the support regions with known HF-based wet etchants. The resist is stripped and polysilicon 16 in the support regions is etched selective to oxide and nitride providing the structure shown in FIG. 6.

It is emphasized that at this point of the inventive method, the array regions contain an oxide layer on the sidewalls of polysilicon layer 16. In contrast, the polysilicon layer of the gate conductor in the support regions does not contain an oxide layer on the sidewalls; the only oxide present in the support region at this time of the process is the remaining gate oxide layer.

Figure 7:
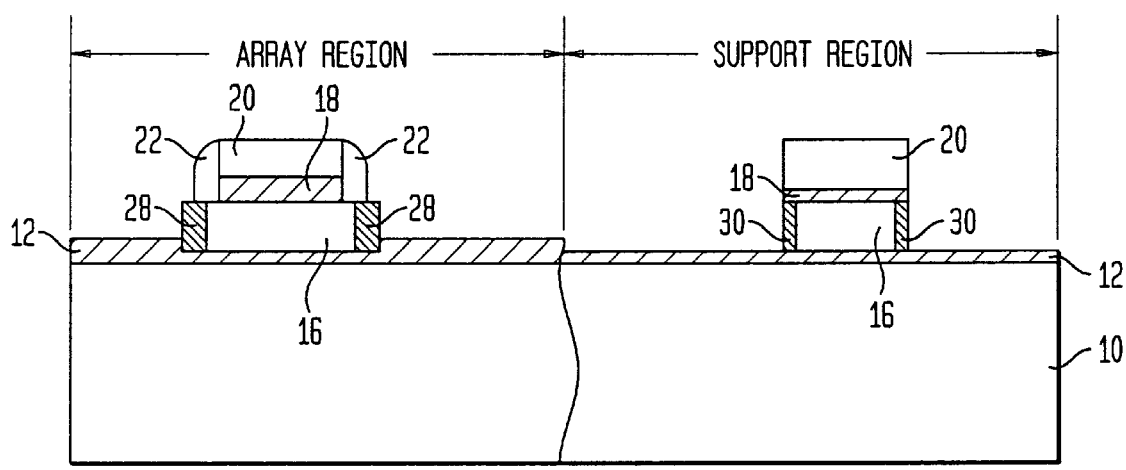

FIG. 7 illustrates the second oxidation step employed in the present invention wherein array oxide layer 28 and support oxide layer 30 are formed. The second oxidation step employed in the present invention is carried out at a temperature of greater than 850° C., preferably greater than 900° C., in an oxidizing ambient such as air, ozone or oxygen. A single temperature may be employed, or alternatively, a series of various ramp and soak cycles may also be used. The time in which the second oxidation step is performed may vary depending on the desired thickness of the oxide layer to be formed, but typically the oxidation step is carried out to grow an oxide having a thickness of from about 3 to about 10 nm.

In accordance with the present invention, the array oxide layer has a greater thickness than the support oxide layer. This is attributed to the fact that the array oxide layer includes oxide layers from both the first and second oxidation steps, whereas the support oxide layer includes oxide only from the second oxidation step; the oxide formed in the first oxidation step, i.e., the sacrificial oxide layer, is removed in the present invention prior to conducting the second oxidation step.

Typically the array oxide layer which is a combination of oxide layers formed from the first and second oxidation steps has a thickness of from about 5 to about 25 nm, whereas the support oxide layer formed only from the second oxidation step has a thickness of from about 3 to about 10 nm.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a gate conductor useful in a semiconductor memory device comprising the steps of:

(a) providing a semiconductor structure including at least a gate oxide layer formed on a surface of a semiconductor substrate, said structure being divided into array regions and support regions which may have different oxide thicknesses;

(b) forming a gate stack on said structure, said gate stack including a layer of polysilicon formed on the gate oxide layer, a conductor material layer formed on said layer of polysilicon, and a nitride cap layer formed on said conductor material layer;

(c) partially mask open etching the gate stack by patterning the nitride cap layer and etching through the gate stack stopping on said layer of polysilicon;

(d) forming spacers on exposed sidewalls of said partially etched gate stack;

(e) completing said mask open etching in said array regions by removing any exposed polysilicon, while not etching said layer of polysilicon in the support regions;

(f) performing a first oxidation step on the structure so as to form an oxide layer on exposed polysilicon sidewalls in said array regions while simultaneously forming a sacrificial oxide layer on said layer of polysilicon in said support regions;

(g) selectively removing said spacers in said support regions of said structure;

(h) selectively removing said sacrificial oxide layer and said layer of polysilicon in said support regions; and (i) performing a second oxidization step on said structure so as to form an array oxide layer and a support oxide layer, said array oxide layer having a thickness that is greater than the support oxide layer, said array oxide layer comprising oxide layers from said first and second oxidation steps.

2. The method of claim 1 wherein said gate oxide layer is formed by a thermal growing process or a deposition process selected from the group consisting of CVD, plasma-assisted CVD, sputtering and evaporation.

3. The method of claim 1 wherein said gate stack is formed by the same or different deposition process selected from the group consisting of CVD, plasma-assisted CVD, plating, sputtering and evaporation.

4. The method of claim 1 wherein an optional barrier layer is formed on said layer of polysilicon prior to forming said conductor material layer.

5. The method of claim 1 wherein said layer of polysilicon is doped by an in-situ deposition doping process or deposition followed by implantation.

6. The method of claim 1 wherein step (c) includes lithography and etching.

7. The method of claim 1 wherein said spacers are formed by deposition and etching.

8. The method of claim 7 wherein said etching occurs during step (e).

9. The method of claim 1 wherein step (e) includes an anisotropic etching process.

10. The method of claim 1 wherein said first oxidation step is carried out at a temperature of greater than 850° C. in an oxidizing ambient.

11. The method of claim 10 wherein said first oxidation step is carried out at a temperature of greater than 900° C.

12. The method of claim 1 wherein step (g) includes the use of an isotropic etch process.

13. The method of claim 1 wherein said second oxidation step is carried out at a temperature of greater than 850° C. in an oxidizing ambient.

14. The method of claim 13 wherein said second oxidation step is carried out at a temperature of greater than 900° C.

* * * * *